(12) United States Patent
Chang

(10) Patent No.: US 6,583,365 B2
(45) Date of Patent: Jun. 24, 2003

(54) CONDUCTIVE PADS LAYOUT FOR BGA PACKAGING STRUCTURE

(75) Inventor: Nai-Shung Chang, Taipei Hsien (TW)

(73) Assignee: Via Technologies, Inc., Taipei Hsien (TW)

( * ) Notice: Subject to any disclaimer, the term of this patent is extended or adjusted under 35 U.S.C. 154(b) by 10 days.

(21) Appl. No.: 10/072,213

(22) Filed: Feb. 7, 2002

(65) Prior Publication Data

US 2002/0153166 A1 Oct. 24, 2002

Related U.S. Application Data

(60) Provisional application No. 60/285,028, filed on Apr. 19, 2001.

(30) Foreign Application Priority Data

Nov. 14, 2001 (TW) ........................................ 90128178 A

(51) Int. Cl.$^7$ ................................................. H05K 1/16
(52) U.S. Cl. ........................ 174/260; 257/737; 361/767; 361/783
(58) Field of Search .................. 174/260; 361/767–780, 361/783; 29/832–841; 257/737–738, 690–700

(56) References Cited

U.S. PATENT DOCUMENTS

| 5,343,074 | A | * | 8/1994 | Higgins et al. ............. 257/666 |
| 5,599,747 | A | * | 2/1997 | Bhatt et al. .................... 29/832 |
| 5,895,967 | A | * | 4/1999 | Stearns et al. ............... 257/691 |
| 6,181,005 | B1 | * | 1/2001 | Arimoto ...................... 257/207 |
| 6,242,814 | B1 | * | 6/2001 | Bassett ....................... 257/200 |
| 6,414,386 | B1 | * | 7/2002 | Beaulieu et al. ............. 257/691 |
| 6,433,441 | B1 | * | 8/2002 | Niwa et al. .................. 257/784 |

\* cited by examiner

*Primary Examiner*—Albert W. Paladini
*Assistant Examiner*—Jeremy Norris

(57) ABSTRACT

A conductive pad layout is implemented on a substrate for BGA packaging structure. The substrate has a top trace surface on which is attached a chip, and a bottom trace surface. The top trace surface includes a first contact pad, a second contact pad placed closer to the chip than the first contact pad, and a reference contact pad placed adjacent to the second contact pad. A first bonding wire connects the first contact pad to the chip, and second and third bonding wires of shorter length respectively connect the second contact pad and the reference contact pad to the chip. Thereby, critical signal can pass through the second bonding wire and second contact pad with reduced interference. A reference dummy ball pad is also placed adjacent to a ball pad corresponding to the second contact pad on a bottom trace surface of the substrate to reduce interference.

17 Claims, 3 Drawing Sheets

CONDUCTIVE PADS LAYOUT FOR BGA PACKAGING STRUCTURE

CROSS-REFERENCE TO RELATED APPLICATION

This application claims the priority benefit of U.S.A. provisional application serial No. 60/285,028, filed on Apr. 19, 2001 and Taiwan application serial no. 90128178, filed Nov. 14, 2001

BACKGROUND OF THE INVENTION

1. Field of the Invention

The invention relates generally to a substrate for BGA packaging structures and, more particularly, the invention relates to a conductive pad layout of the substrate used in BGA packaging structure.

2. Description of the Related Art

As high-density integrated circuit (IC) devices operate faster (order of MHz) and necessitate an increasing number of input/output (I/O) connections, higher performances of semiconductor packaging structures are required. In this context, traditional packaging structures such as Quad Flat Packages (QFP) or Pin-Grid Array (PGA) packages have reached their bottleneck. For illustration, QFP and PGA packaging structures usually provide a number of connection pins that vary within a limit of about 100 to 200, which is insufficient with respect to presently developed technology.

It is common for presently constructed personal computers to include 64-bits microprocessors. The core logic circuit of the personal computer has to be connected to the microprocessor and other devices including dynamic random access memory (DRAM) as principal memory of the system, and static random access memory (SRAM) as fast access memory. Additionally, the 64-bits microprocessor has to be connected to a 64-bits bus. As a result, if the core logic circuit is fabricated from a single IC chip, each data bus has to be corresponded to each address bus, which typically results in a number of connection pins amounting to 200. When other control signals are further included, this number easily exceeds 300 of connection pins.

Ball Grid Array (BGA) packaging structures offer many advantages that can fulfill the requirements of presently developed technology. BGA packaging structures provide a high number of I/O connections while enabling a size reduction of the packaging structure. Furthermore, by having short signal paths, BGA packaging structures generate reduced electrical inductance and reduced ground bounce.

BGA packaging structures are typically fabricated from a printed circuit substrate onto which a chip is attached and electrically connected. After the chip is mounted onto the circuit substrate, bonding wires are formed to connect the contact pads of the chip to the circuit substrate. An encapsulant material then is molded onto the chip, the bonding wires, and the circuit substrate, and via a reflow process, solder balls are formed on the bottom surface of the circuit substrate.

Referring to FIG. 1, a schematic view illustrates a conductive pad layout of conventional BGA packaging structures. In FIG. 1, a substrate 100 has front trace surface I on which is mounted a chip 120, and a bottom trace surface II where the BGA packaging structure is connected to external devices. Both top trace surface I and bottom trace surface II are shown in juxtaposition way in FIG. 1. A plurality of contact pads (111, 112, 113) are defined in a contact pad zone 110 on the top trace surface I. The contact pad zone 110 is located at one side of the chip 120.

A plurality of bonding wires (131, 132, 133) connect the chip 120 to the contact pads (111, 112, 113). The contact pads (111, 112, 113) connect to a plurality of vias (151, 152, 153) connected to corresponding ball pads (141, 142, 143).

Because the bonding wires (131, 132, 133) have the same length and are relatively long, crosstalk is conventionally generated between the bonding wires. Undesirable interference is also generated between the traces connecting vias (151, 152, 153) to the ball pads (141, 142, 143). As a result, signal transmission from the chip 120 through the BGA packaging structure may be negatively affected.

SUMMARY OF THE INVENTION

It is therefore an object of the invention to provide a conductive pad layout for BGA packaging structures that can reduce negative interference with respect to the contact pads that transmit critical signals.

To accomplish the above and other objectives, a conductive pad layout of the invention is implemented on a substrate for BGA packaging structures. The substrate has a top trace surface on which is mounted a chip, and an opposite bottom trace surface. A first contact pad and a second contact pad are defined on the top trace surface, wherein the second contact pad is closer to the chip than the first contact pad. The second contact pad transmits a critical signal of the BGA packaging structure. An anti-interference contact pad connected to a reference voltage is further defined adjacent to the second contact pad. First, second, and third bonding wires respectively connect the first, second, and anti-interference contact pads to the chip. The second and third bonding wires are shorter than the first bonding wire. With a shorter bonding wire and an adjacent reference contact pad, a critical signal is transmitted through the second bonding wire and the second contact pad with reduced interference. A less critical signal can be transmitted through the first bonding wire and the first contact pad. A first ball pad and a first via connected to the first ball pad are defined on the bottom trace surface. A second ball pad and a second via connected to the second ball pad are defined on the bottom trace surface. A dummy ball pad is further defined adjacent to the second ball pad. The first via connects the first contact pad via a first conductor member and the second via connects the second contact pad via a second conductor member. The dummy ball pad is defined as a reference connection of the substrate and does not connect any vias to reduce interference.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DETAILED DESCRIPTION OF THE PREFERRED EMBODIMENTS

Figure 1:
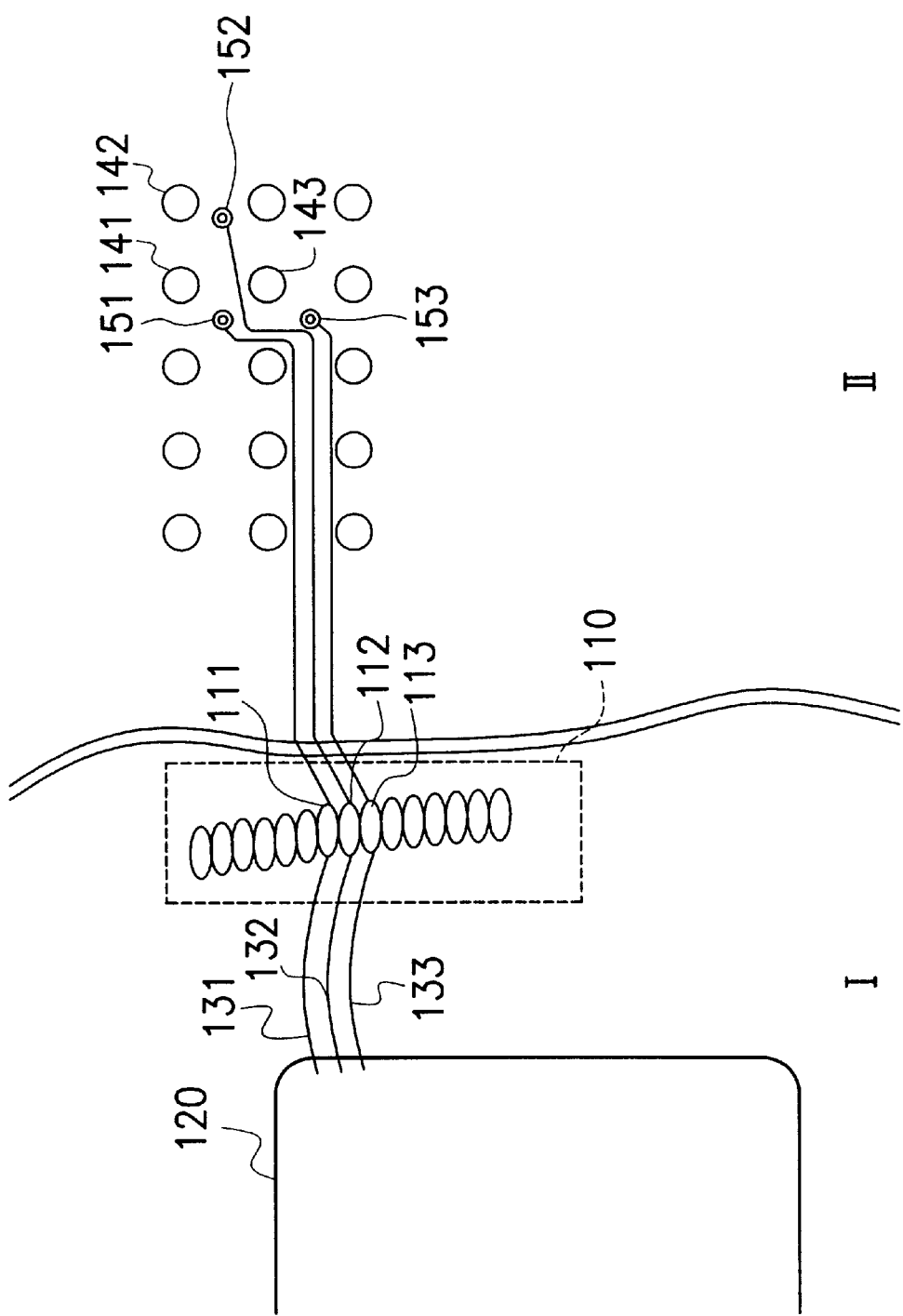
FIG. 1 is a schematic view that schematically illustrates a conventional conductive pad layout.

The following detailed description of the embodiments and examples of the present invention with reference to the accompanying drawings is only illustrative and not limiting. Wherever possible in the following description and accompanying drawings, like reference numerals and symbols will refer to like elements and parts unless otherwise described.

Figure 2:
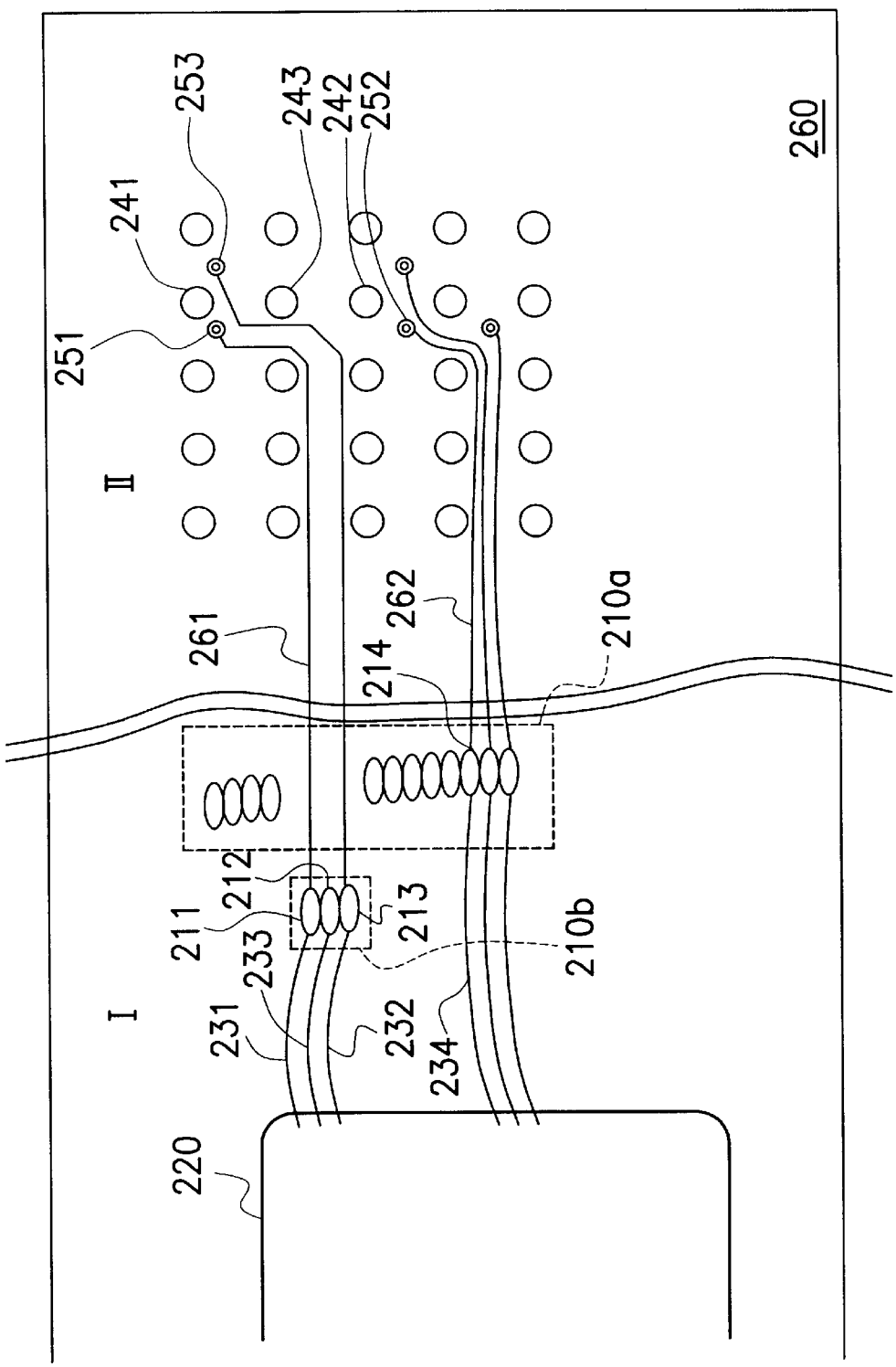
FIG. 2 and FIG. 3 are schematic views showing a conductive pad layout according to various embodiments and examples of the invention.

Referring to FIG. 2, a schematic view illustrates a contact pad layout for BGA packaging structure according to an embodiment of the invention. As shown in FIG. 2, the contact pad layout of the invention is implemented on a substrate 260 on which a chip 220 is mounted and attached. The substrate 260 comprises at least a top trace surface I where the chip 220 is placed, and a bottom trace surface II opposite to the top trace surface I. For the sake of easy understanding, both top trace surface I and bottom trace surface II are juxtaposed in the view of FIG. 2. A power source layer (not shown) and a ground source layer (not shown) are further respectively sandwiched between the bottom trace surface and the top trace surface. The layer structure as described above does not preclude other possible layer structures that may be also adequate with the invention.

A plurality of conductive pads are defined in a first contact pad zone 210a and a second contact pad zone 210b on the top trace surface I. More particularly, the second contact pad zone 210b comprises a plurality of critical contact pads 211, 213 and at least an anti-interference contact pad 212. The critical contact pads 211, 213 include contact pads through which high-frequency signals and other critical signals from the chip 220, such as address and data strobe signals or timing signals, are transmitted. The anti-interference contact pad 212 is placed between the critical contact pads 211, 213. The first contact pad zone 210a includes contact pads 214 where less critical signals such as memory address signals, memory row and column signals, or memory control signals, are transmitted.

In the invention, the second contact pad zone 210b is located closer to the chip 220 than the first contact pad zone 210a. Hence, the electrical connection is established via different lengths of bonding wires. The invention uses three types of bonding wires, which are short bonding wires, intermediate bonding wires, and long bonding wires respectively according to an increasing order of length. Short bonding wires may connect the chip to the ground and power sources (see FIG. 3). Intermediate bonding wires may connect the chip to the power source. Lower arcuate and higher arcuate bonding wires may be further distinguished among intermediate bonding wires.

As shown in FIG. 2, long bonding wires 234 connect the contact pads 214 of the first conductive contact pad zone 210a to the chip 220. Intermediate bonding wires (231, 232, 233) of shorter length connect the critical/anti-interference contact pads (211, 212, 213) of the second conductive contact pad zone 210b to the chip 220. The bonding wires 231, 232 connecting the chip 220 to the critical contact pads 211, 212 are approximately of the same length as that of the bonding wire 233 connecting the chip 220 to the anti-interference contact pad 212. By positioning the second conductive contact pad zone 210b closer to the chip 220, critical signals pass through shorter intermediate bonding wires 231, 232, which reduces negative crosstalk effects. Furthermore, undesirable interference is reduced via the anti-interference contact pad 212 adjacently placed between the neighboring critical contact pads 211, 213 and further connected to a reference voltage of ground source or power source. The power source to which the anti-interference contact pad 212 may be connected depends on the actual connection configuration implemented. In the present embodiment, because the critical contact pads 211, 213 principally concern the connection of a CPU chip, the power source is thus preferably the CPU operating power source (called VTT). Those skilled in the art would readily understand that other power sources might be also adequate with the invention. With a reference voltage bonding wire 233 that is interposed between the neighboring bonding wires 231, 232 connected to critical contact pads 211, 213, undesirable interference between the neighboring bonding wires 231, 232 is thus favorably reduced and signal transmission quality is thereby improved.

The bottom trace surface II further includes a plurality of ball pads 241, 242, at least a dummy ball pad 243, and a plurality of vias 251, 252, 253. A plurality of conductor members 261, 262 connect the critical contact pads 211, 213 to the vias 251, 253 while conductor members 262 connect the contact pads 214 to the via 252. The ball pad 241 connects the via 251 while the ball pad 242 connects the via 252. "Conductor members" refer to the conductive elements of the packaging structure that conventionally have the function of establishing electrical connection with the ball pads within the substrate 260. The illustration of the drawings therefore only shows a functional representation of the conductor members that should not be strictly interpreted into any physical structure.

The dummy ball pad 243 is disposed at a location adjacent to the ball pad 241. The dummy ball pad 243 does not connect any vias, and is defined as a ground source connection. Hence arranged, the ground source dummy ball pad 243 favorably reduces undesirable interference between the conductor members 261, 262 on the bottom trace layer II. Since the dummy ball pad 243 does not connect any vias, its disposition on the bottom trace layer II does not require further formation of conductor traces that may induce additional trace interference.

Figure 3:
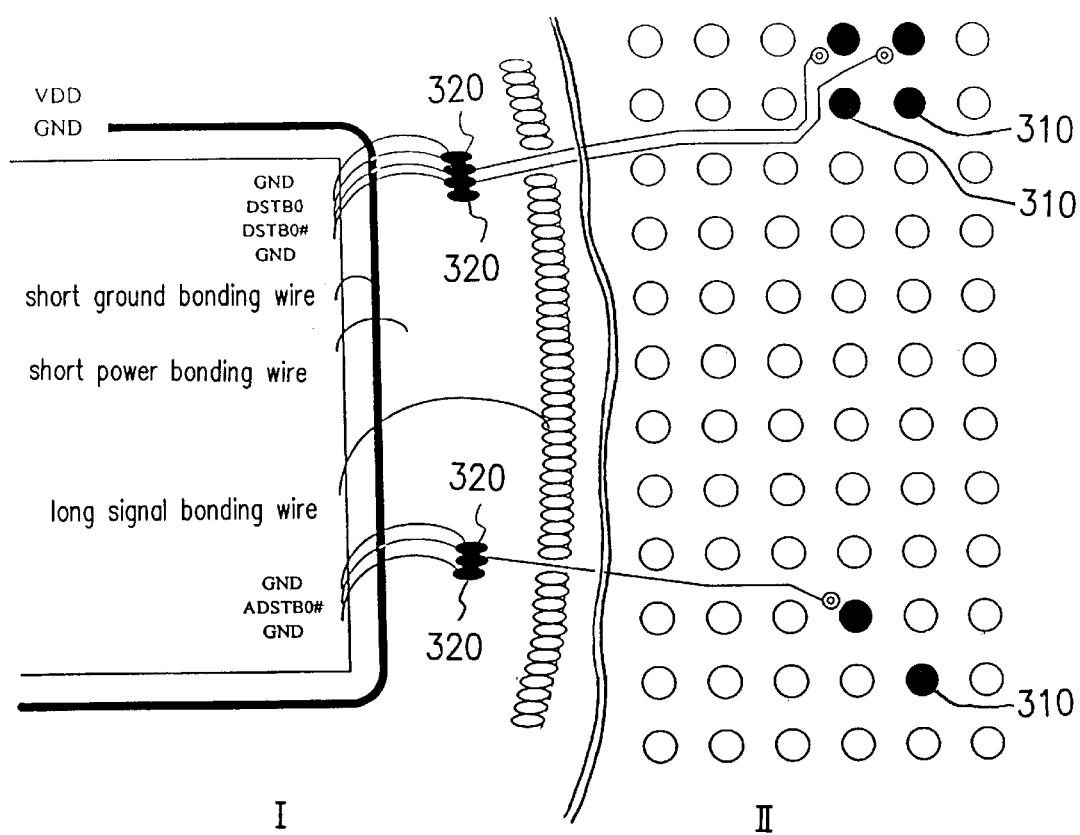

As shown in FIG. 3, the layout of the invention may be implemented with critical contact pads 212 placed in interposition between the anti-interference contact pads 320. Ideally, an anti-interference contact pad 212 should be placed adjacent to every critical contact pad to minimize interference effects. Being connected to the ground, the anti-interference contact pad enables the critical signal that is transmitted through the adjacent bonding wire to be rapidly referenced to the ground, which enhances the signal transmission. The dummy ball pads 310 may be further placed adjacent to one ball pad according to various fashions.

It should be apparent to those skilled in the art that other structures that are obtained from various modifications and variations of the structures of the above-described invention would be possible without departing from the scope and spirit of the invention as illustrated herein. Therefore, the above description of embodiments and examples only illustrates specific ways of making and performing the invention that, consequently, should cover variations and modifications thereof provided they fall within the scope of the invention as defined in the following claims.

What is claimed is:

1. A conductive pad layout for ball grid array (BGA) packaging structure implemented on a circuit substrate that includes a front surface where a chip is mounted, the conductive pad layout comprising:

a first contact pad defined on the front surface of the circuit substrate;

a first bonding wire connecting the chip to the first contact pad;

a second contact pad defined on the front surface of the circuit substrate, the second contact pad being closer to the chip than the first contact pad and transmitting a critical signal;

an anti-interference contact pad defined at a location on the front surface of the circuit substrate that is adjacent to the second contact pad, wherein the anti-interference contact pad is further connected to a reference voltage and the chip connects the anti-interference contact pad via a third bonding wire of approximately the same length as the second bonding wire; and a second bonding wire connecting the chip to the second contact pad, the second bonding wire being shorter than the first bonding wire so that interference therebetween is thereby prevented.

2. The conductive pad layout of claim 1, wherein the second contact pad transmits an address strobe signal, a data strobe signal, or a timing signal that are critical signals.

3. The conductive pad layout of claim 1, wherein the first contact pad transmits memory address signals, memory row and column signals, or memory control signals that are signals less critical than that of the second contact pad.

4. The conductive pad layout of claim 1, wherein the reference voltage is a ground source or a power source.

5. A conductive pad layout for ball grid array (BGA) packaging structure implemented on a circuit substrate that includes a front surface where a chip is mounted, the conductive pad layout comprising:

a contact pad defined on the front surface of the circuit substrate and transmitting a critical signal;

an anti-interference contact pad defined adjacent to the contact pad and connected to a reference voltage;

a first bonding wire connecting the chip to the contact pad;

a second bonding wire connecting the chip to the anti-interference contact pad, thereby preventing undesirable interference with the first bonding wire;

a ball pad defined on a bottom surface of the circuit substrate that is opposite to the front surface; and a dummy ball pad defined adjacent to the ball pad as a reference voltage connection and not connected to any vias.

6. The conductive pad layout of claim 5, wherein the reference voltage is a ground source or a power source.

7. The conductive layout of claim 5, wherein the contact pad transmits an address strobe signal, a data strobe signal, or a timing signal that are critical signals.

8. The conductive pad layout of claim 5, further comprising:

a via defined through the circuit substrate to connect the ball pad; and a conductor trace connecting the contact pad to the via.

9. A conductive pad layout for ball grid array (BGA) packaging structure implemented on a circuit substrate that includes a front surface where a chip is mounted, the conductive pad layout comprising:

a first contact pad defined on the front surface of the circuit substrate;

a first bonding wire connecting the chip to the first contact pad;

a second contact pad defined on the front surface of the circuit substrate, the second contact pad being closer to the chip than the first contact pad and transmitting a critical signal;

a second bonding wire connecting the chip to the second contact pad, the second bonding wire being shorter than the first bonding wire;

an anti-interference contact pad defined at a location on the front surface of the circuit substrate that is adjacent to the second contact pad, wherein the anti-interference contact pad is further connected to a reference voltage and the chip connects the anti-interference contact pad via a third bonding wire of approximately the same length as the second bonding wire;

a first ball pad defined on a bottom surface of the circuit substrate that is opposite to the front surface, the first ball pad being connected to the second contact pad by means of a first via defined through the circuit substrate; and a dummy ball pad defined adjacent to the first ball pad, the dummy ball pad being not connected to any via and defined as ground connection.

10. The conductive pad layout of claim 9, wherein the second contact pad transmits an address strobe signal, a data strobe signal, or a timing signal that are critical signals.

11. The conductive pad layout of claim 9, wherein the first contact pad transmits memory address signals, memory row and column signals, or memory control signals that are signals less critical than that of the second contact pad.

12. The conductive pad layout of claim 9, wherein the reference voltage is a ground source or a power source.

13. A conductive pad layout for ball grid array (BGA) packaging structure implemented on a circuit substrate that includes a front surface where a chip is mounted, the conductive pad layout comprising:

a first contact pad defined on the front surface of the circuit substrate;

a first bonding wire connecting the chip to the first contact pad;

a second contact pad defined on the front surface of the circuit substrate, the second contact pad being closer to the chip than the first contact pad and transmitting a critical signal;

a first ball pad defined on a bottom surface of the circuit substrate that is opposite to the front surface;

a first via defined through the circuit substrate to connect the first ball pad;

a first conductor trace connecting the second contact pad to the first via;

a dummy ball pad defined adjacent to the first ball pad, the dummy ball pad being not connected to any via; and a second bonding wire connecting the chip to the second contact pad, the second bonding wire being shorter than the first bonding wire so that interference there between is thereby prevented.

14. The conductive pad layout of claim 13, wherein the second contact pad transmits an address strobe signal, a data strobe signal, or a timing signal that are critical signals.

15. The conductive pad layout of claim 13, wherein the first contact pad transmits memory address signals, memory row and column signals, or memory control signals that are signals less critical than that of the second contact pad.

16. The conductive pad layout of claim 13, wherein the dummy ball pad is defined as a ground connection.

17. The conductive pad layout of claim 13, further comprising:

a second ball pad defined on the bottom surface of the circuit substrate;

a second via defined through the circuit substrate to connect the second ball pad; and a second conductor trace connecting the first contact pad to the second via.

\* \* \* \* \*